United States Patent [19]

Ayukawa et al.

[11] Patent Number: 5,183,770
[45] Date of Patent: Feb. 2, 1993

[54] SEMICONDUCTOR DEVICE

[75] Inventors: Akitsu Ayukawa; Shigeo Onishi, both of Nara, Japan

[73] Assignee: Sharp Kabushiki Kaisha, Osaka, Japan

[21] Appl. No.: 842,515

[22] Filed: Feb. 27, 1992

[30] Foreign Application Priority Data

Mar. 4, 1991 [JP] Japan .................................. 3-037585
May 27, 1991 [JP] Japan .................................. 3-120805
Feb. 3, 1992 [JP] Japan .................................. 4-017754

[51] Int. Cl.$^5$ .................... H01L 21/336; H01L 21/324
[52] U.S. Cl. ........................................ 437/41; 437/44; 437/247
[58] Field of Search ............... 437/40, 41, 44, 34, 437/56, 57, 247

[56] References Cited

U.S. PATENT DOCUMENTS 4,642,878 2/1987 Maeda .................................. 437/44
5,087,582 2/1992 Campbell et al. .................... 437/41

OTHER PUBLICATIONS

Pfiesfer, "LDD MOSFET's Using Disposable Sidewall Spacer Technology", *IEEE Electron Device Letters*, vol. 9, No. 4, Apr. 1988, pp. 189-192.

*Primary Examiner*—Mary Wilczewski
*Attorney, Agent, or Firm*—Nixon & Vanderhye

[57] ABSTRACT

A method for fabricating a semiconductor device in which diffusion regions are formed in a silicon substrate with use of a gate electrode parts having side walls as a mask, including the steps of: (a) forming a gate electrode on a silicon substrate with a gate oxide interposed therebetween; (b) depositing an insulation film to entirely cover the substrate and the gate electrode, followed by depositing a polysilicon or amorphous silicon layer on the insulation film; (c) forming side walls of $SiO_2$ on lateral sides of the gate electrode covered with the insulation film and the polysilicon or amorphous silicon layer, followed by ion implantation; and (d) subjecting the resulting substrate to a heat treatment at a medium temperature after removal of the side walls, followed by stacking an interlayer insulator after removal of the polysilicon or amorphous silicon layer, and subjecting the resultant to a heat treatment at a high temperature.

14 Claims, 2 Drawing Sheets

SEMICONDUCTOR DEVICE

FIELD OF THE INVENTION

This invention relates to a method for fabricating semiconductor devices. More specifically, it relates to a method for fabricating MOS devices having the so-called LDD structure in which diffusion regions are formed in a silicon substrate with use of a gate electrode part having side walls as a mask. This method reduces crystalline defects of the Si substrate significantly.

RELATED ARTS

A typical and conventional method for fabricating a MOS device having a LDD structure is illustrated with reference to FIG. 2.

First, a gate electrode 13 is formed on a Si substrate 11 with a $SiO_2$ film 12 interposed therebetween in accordance with a common method [See FIG. 2(a)]. Subsequently, the Si substrate 11 and the gate electrode 13 are thoroughly covered with another $SiO_2$ film by CVD process. Such a $SiO_2$ film is then subjected to reactive ion etching (RIE) and HF cleaning but is retained around the gate electrode and on the substrate, to form side walls [See FIG. 2(b)]. In this case the thickness of the $SiO_2$ film 14a retained on the substrate is about 100–400 Å. Next, impurity ions 15 are implanted with use of the gate electrode and side walls as a mask [See FIG. 2(c)], followed by a heat treatment at an elevated temperature, to form diffusion regions in the Si substrate.

With the above method, however, oxygen existing in the $SiO_2$ film is injected along with the impurity ions into the Si substrate thereby fixing crystalline defects 16 of the substrate. These defects 16 cannot be removed even if subjected to the subsequent heat treatment at a high temperature. Furthermore, since the retained $SiO_2$ film 14a resulted from the RIE and HF cleaning is largely irregular in thickness, the defect density of the substrate is made higher, leading to occurrence of current leakage and decrease in yield.

SUMMARY OF THE INVENTION

The present invention is accomplished to overcome the foregoing problems.

Thus, the invention provides a method for fabricating a semiconductor device, comprising the steps of:

(a) forming a gate electrode on a semiconductor silicon substrate with a gate oxide interposed therebetween;

(b) depositing an insulation film to entirely cover the substrate and the gate electrode, followed by depositing a polysilicon or amorphous silicon layer on the insulation film;

(c) forming side walls of $SiO_2$ on lateral sides of the gate electrode covered with the insulation film and the polysilicon or amorphous silicon layer, followed by ion implantation; and (d) subjecting the resulting substrate to a heat treatment at a medium temperature after removal of the side walls, stacking an interlayer insulator after removal of the polysilicon or amorphous silicon layer, and subjecting the sultant to a heat treatment at a high temperature.

Each of the above-mentioned steps (a) to (d) of the present invention can be carried out using known means and apparatus.

In step (a), a gate electrode is formed on a Si substrate with a gate oxide sandwiched therebetween. The gate oxide is formed by a thermal oxidation process. The gate electrode may be composed of a single polysilicon layer or a stacked layer of polysilicon, non-doped silicated glass (NSG), boron-doped phospho-silicate glass (BPSG) and the like. These layers can be formed by CVD process.

In next step (b), first, an insulation film is formed to entirely cover the substrate and the gate electrode, and a polysilicon or amorphous silicon layer is then formed on the insulation film.

The insulation film may be the same $SiO_2$ film as the gate oxide in the above step (a) but may be a SiN film. Preferably the insulation film is 50 to 100 Å in thickness. The polysilicon or amorphous silicon layer can be formed by LPCVD technique, using a Si compound such as $Si_2H_6$, $SiH_4$, $SiH_2Cl_2$, $SiCl_4$ or the like. The polysilicon layer is in general formed by CVD technique at a relatively high temperature such as 600° to 650° C. under a pressure of 10 to 50 Pa. The amorphous silicon layer is in general formed by CVD technique at a relatively low temperature such as 450° to 500° C. under a pressure of 10 to 50 Pa. Preferably, these polysilicon layer or amorphous silicon layer are 100 to 200 Å in thickness.

In next step (c), side walls are formed. They are formed in a manner that $SiO_2$ is first deposited by LPCVD technique to entirely cover the amorphous silicon layer or polysilicon layer and then etched.

A dry etching method is used and particularly, RIE method is available which uses positive ions (for example $CF_3^+$ etc.) generated by applying high-frequency power to a carbon floride gas such as $CF_4$, $C_2F_6$, $CHF_3$ or the like under vacuum to cause it to discharge.

After this RIE method, a HF treatment may be carried out for example in order to etch the edge part of the side wall. Subsequently, ions such as $As^+$, $P^+$ or the like are vertically implanted to the Si substrate.

In next step (d), first, the side walls are removed by a HF treatment to make the device stress-free. Thereafter, a heat treatment is conducted for the purpose of forming in the Si substrate a diffusion region of the implanted ions. This suitable heat treatment is for example that at a medium temperature of 800° to 850° C. Sequentially the polysilicon layer or amorphous silicon layer is removed by etching. a dry etching method is used, and particularly, RIE method having a strong isotropic property which uses $CCL_4$, $SF_6$ or the like is available. An interlayer insulator is then stacked on the entire surface. The interlayer insulator may comprise a single BPSG layer or a stacked layer of NSG and BPSG in this order.

The heat treatment at a high temperature, for example at 900° to 950° C. is then performed to planarise the interlayer insulator and to complete the formation of the diffusion regions.

DETAILED DESCRIPTION OF THE PREFERRED EMBODIMENTS

The present invention will be more fully described by way of the following Examples with reference to the drawings. The Examples are merely examples and are not intended to limit the invention.

EXAMPLE 1

Figure 1A:
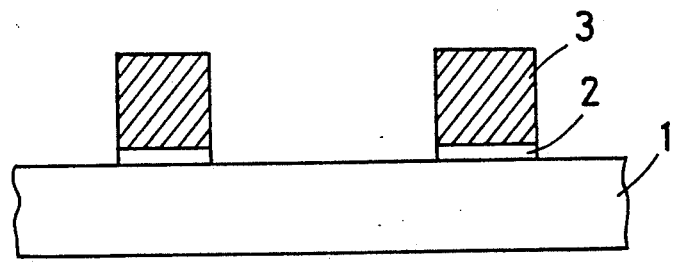
FIG. 1 (a)–(d) schematically illustrates fabrication steps of a semiconductor device according to a method for fabricating a semiconductor device of the invention.

As shown in FIG. 1(a), a gate electrode 3 is formed on a Si substrate 1 by CVD technique with a gate oxide sandwiched therebetween. A small amount of $SiO_2$ existing on the substrate 1 is then removed with hydrofluoric acid.

Figure 1B:
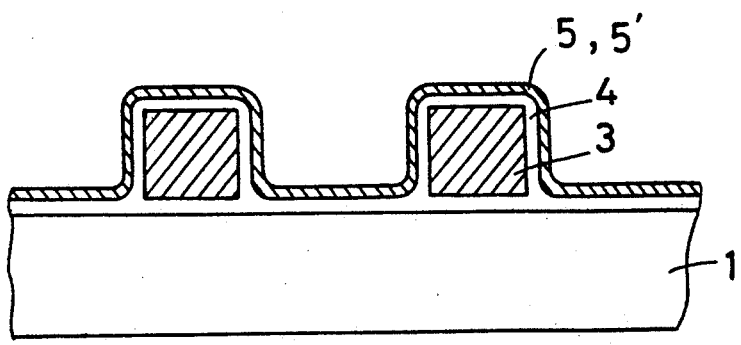

Next, as shown in FIG. 1(b), the overall surface of the Si substrate 1 and the gate electrode 3 undergoes thermal oxidation to form a $SiO_2$ insulation film 4 of about 50-100 Å thick. On the film 4 is deposited a polysilicon layer 5 to about 100-200 Å thick by a CVD technique using $Si_2H_6$ at 620° C. under 20 Pa.

Figure 1C:
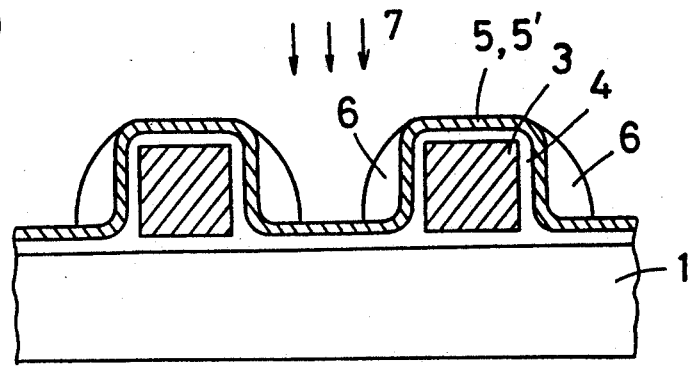
Figure 1D:
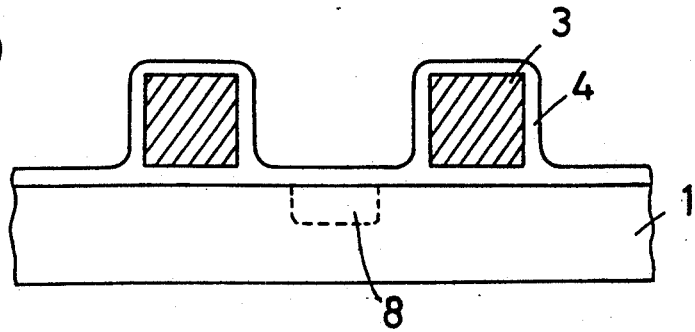
Figure 2A:
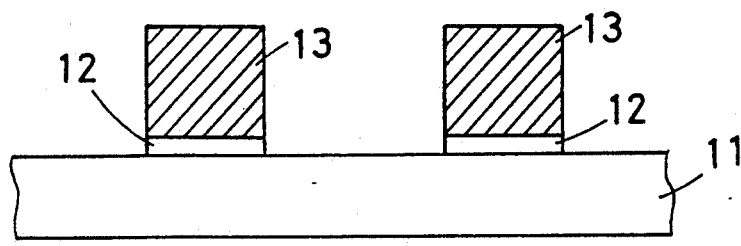
FIG. 2 (a)–(c) schematically illustrates fabrication steps of a semiconductor device according to a conventional method for fabricating a semiconductor device.
Figure 2B:
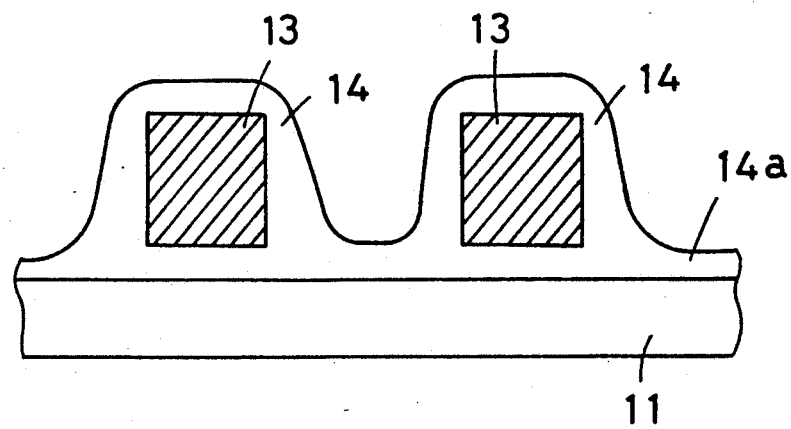
Figure 2C:
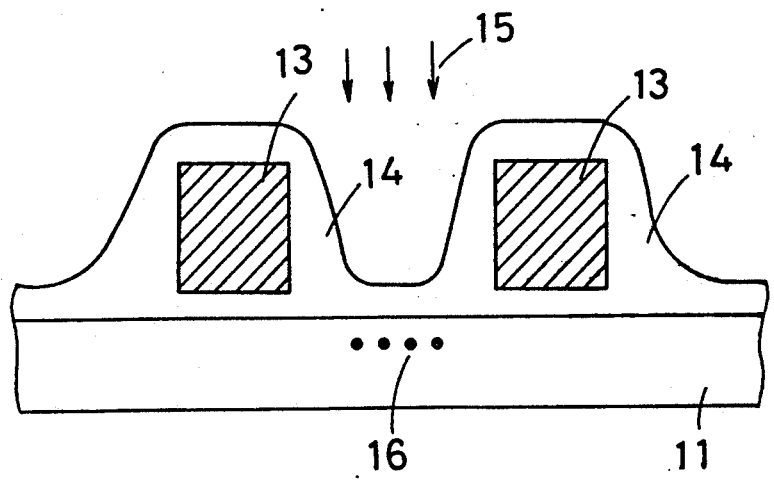

In turn, as shown in FIG. 1(c), $SiO_2$ is deposited by CVD technique and etched by RIE method using $CF_4$ with optional HF cleaning to form side walls 6 on both sides of the gate electrode portion including the $SiO_2$ insulation film 4 and the polysilicon layer 5. Subsequently, $As^+$ ions are implanted (indicated by an arrow 7) at an acceleration energy of 60-80 KeV and a dose of $5 \times 10^{15}$ with use of the gate electrode portion and side walls 6 as a mask.

Thereafter, the side walls are removed by a hydrofluoric acid treatment to make the device stress-free, then a heat treatment at 800°-850° C. is conducted to form a diffusinon region 8, followed by removal of the polysilicon layer 5 by RIE method using $CCl_4$, as shown in FIG. (d). A BPSG layer is deposited over the entire surface of the device by a common technique, and a heat treatment at 900°-950° C. is conducted to planarize the BPSG layer, followed by forming a contact hole and metallic wiring. Thus, a semiconductor device is completed.

EXAMPLE 2

As shown in FIG. 1(a), a gate electrode 3 is first formed on a Si substrate 1 by the same technique as that in Example 1 with a gate oxide sandwiched therebetween. A small amount of $SiO_2$ existing on the substrate 1 is then removed with hydrofluoric acid.

Next, as shown in FIG. 1(b), the overall surface of the Si substrate 1 and the gate electrode 3 undergoes thermal oxidation to form a $SiO_2$ insulation film 4 of about 50-100 Å thick. On the film 4 is deposited an amorphous silicon layer 5' to about 100-200 Å thick by a CVD technique using $Si_2H_6$ at 460° C. under 20 Pa.

In turn, as shown in FIG. 1(c), $SiO_2$ is deposited by CVD technique and etched by RIE method using $CF_4$ with optional HF treatment to form side walls 6 on both sides of the gate electrode portion including the $SiO_2$ film 4 and the amorphous silicon layer 5'. Subsequently, $As^+$ ions are implanted (indicated by an arrow 7) at an acceleration energy of 60-80 KeV and a dose of $5 \times 10^{15}$ with use of the gate electrode portion and side walls 6 as a mask.

Thereafter, the side walls are removed by a HF treatment to make the device stress-free, then a heat treatment at 800°-850° C. is conducted to diffuse the implanted ions, followed by removal of the amorphous silicon layer 5' by RIE method using $CCl_4$, as shown in FIG. (d). NSG layer and a BPSG layer are deposited in turn over the entire surface of the device by a common technique, and a heat treatment at 900°-950° C. is conducted to planarize the above layers, followed by forming a contact hole and metallic wiring. Thus, a semiconductor device is completed.

According to the present invention, formation of the polysilicon or amorphous silicon layer over the $SiO_2$ insulation film covering the Si substrate makes it possible to materially reduce the amount of oxygen of the $SiO_2$ insulation film to possibly be injected into the Si substrate as ions are implanted. Hence, the diffusion layer formed after the heat treatment has significantly reduced crystalline defects. Furthermore, the polysilicon or amorphous silicon layer blocks the etching for making side-walls, resulting in reduced variation in thickness of the $SiO_2$ insulation film and polysilicon or amorphous silicon layer. This turns out to be facilitated control of film thickness and decreased defect density in the diffusion layer. In addition, the amorphous silicon layer is substantially equivalent to the $SiO_2$ insulation film in injection coefficient, leading to uniform ion implantation. This results in an improved semiconductor device of reduced leakage of current, sufficient resistance against junction stress, enhanced reliability and increased yield.

What is claimed is:

1. A method for fabricating a semiconductor device, comprising the steps of:
    (a) forming a gate electrode on a semiconductor silicon substrate with a gate oxide interposed therebetween;
    (b) depositing an insulation film to entirely cover the substrate and the gate electrode, followed by depositing a polysilicon or amorphous silicon layer on the insulation film;
    (c) forming side walls of $SiO_2$ on lateral sides of the gate electrode covered with the insulation film and the polysilicon or amorphous silicon layer, followed by ion implantation; and then
    (d) subjecting the substrate to a heat treatment at a first temperature for forming a diffusion region after removal of the side walls, stacking an interlayer insulator over the substrate including the gate electrode after removal of the polysilicon or amorphous silicon layer, and then subjecting the substrate to a heat treatment at a second temperature higher than the first temperature for planarizing the interlayer insulator.

2. A method according to claim 1 wherein the insulation film is a $SiO_2$ film.

3. A method according to claim 1 wherein the interlayer insulator comprises a single BPSG layer or a stacked layer of NSG or BPSG.

4. A method according to claim 1 wherein a heat treatment at the first temperature is conducted at 800° to 850° C.

5. A method according to claim 1 wherein a heat treatment at the second temperature is conducted at 900° to 950 ° C.

6. A method for fabricating a semiconductor device, comprising:
    forming a gate electrode on a semiconductor silicon substrate with a gate oxide interposed therebetween;
    depositing an insulation film over the substrate and gate electrode;
    depositing a polysilicon or amorphous silicon layer on the insulation film;

forming sidewalls of SiO$_2$ on lateral sides of the insulation covered gate electrode and the polysilicon or amorphous silicon layer;

implanting ions into the substrate using the sidewalls and gate electrode as a mask;

removing the sidewalls;

heating the substrate to a first temperature;

removing the polysilicon or amorphous silicon layer;

depositing at least one layer of insulation over the surface of the device; and heating the substrate at a second temperature higher than the first temperature.

7. A method according to claim 6 wherein the first temperature is sufficient to diffuse the implanted ions in the semiconductor silicon substrate.

8. A method according to claim 7 wherein the second temperature is sufficient to planarize the at least one layer of insulation.

9. A method according to claim 6 wherein the insulation film is a SiO$_2$ film.

10. A method according to claim 6 wherein the at least one layer of insulation includes a single BPSG layer or a stacked layer of NSG and BPSG.

11. A method according to claim 6 wherein the first temperature is in the range of 800° to 850° C.

12. A method according to claim 6 wherein the second temperature is in the range of 900° to 950° C.

13. A method according to claim 6 wherein ions are implanted at an energy in the range of 60-80 KeV.

14. A method according to claim 6 wherein the polysilicon or amorphous silicon layer reduces the amount of oxygen from the insulation film that is injected into the silicon substrate during ion implantation to reduce crystalline defects therein.

* * * * *